(12) United States Patent
Moslehi Bajestan et al.

(10) Patent No.: US 10,447,204 B2
(45) Date of Patent: Oct. 15, 2019

(54) SWITCHABLE INDUCTOR NETWORK FOR WIDEBAND CIRCUITS

(71) Applicant: Qualcomm Incorporated, San Diego, CA (US)

(72) Inventors: Masoud Moslehi Bajestan, San Diego, CA (US); Mehran Mohammadi Izad, San Diego, CA (US); Mohammad Farazian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 125 days.

(21) Appl. No.: 15/705,855

(22) Filed: Sep. 15, 2017

(65) Prior Publication Data

US 2019/0089304 A1    Mar. 21, 2019

(51) Int. Cl.
*H03B 5/12* (2006.01)
*H01F 27/28* (2006.01)
*H01F 21/12* (2006.01)

(52) U.S. Cl.
CPC .......... *H03B 5/1268* (2013.01); *H01F 21/12* (2013.01); *H01F 27/28* (2013.01); *H03B 5/1212* (2013.01); *H03B 5/1215* (2013.01); *H03B 5/1228* (2013.01); *H03B 5/1243* (2013.01); *H01F 2021/125* (2013.01); *H03B 5/124* (2013.01); *H03B 2200/0062* (2013.01); *H03B 2200/0086* (2013.01); *H03B 2201/0266* (2013.01)

(58) Field of Classification Search
CPC .......... H03B 5/1268; H03B 2200/0086; H03B 2200/0048; H03B 2201/025; H03B 2201/0266; H01F 21/12; H01F 2021/125; H01F 27/2804
See application file for complete search history.

(56) References Cited

U.S. PATENT DOCUMENTS

| 8,531,250 | B1* | 9/2013 | Luschas | H03B 5/1228 257/531 |
| 8,571,511 | B2* | 10/2013 | Goldfarb | H03D 7/1441 455/290 |
| 8,742,859 | B2* | 6/2014 | Jin | H01F 21/12 331/117 FE |
| 8,842,410 | B2 | 9/2014 | Chan | |

(Continued)

OTHER PUBLICATIONS

"Non-Final Office Action", U.S. Appl. No. 15/706,034, dated Nov. 29, 2018, 15 pages.

*Primary Examiner* — Ryan Johnson
(74) *Attorney, Agent, or Firm* — Colby Nipper/Qualcomm

(57) ABSTRACT

The present disclosure describes aspects of a switchable inductor network for wideband circuits. In some aspects, the switchable inductor network provides selectable inductance. The switchable inductor network includes a first coil and a second coil that includes a first inductive segment and a second inductive segment. Connection points of the second coil connect the second coil across a portion of the first coil. The switchable inductor network also includes a switch connected between the first inductive segment and the second inductive segment of the second coil. The switch is configured to change the selectable inductance of the switchable inductor network by selectively coupling the first inductive segment to the second inductive segment of the second coil in response to a control signal.

36 Claims, 8 Drawing Sheets

(56) References Cited

U.S. PATENT DOCUMENTS

| | | | |
|---|---|---|---|
| 8,860,521 B2* | 10/2014 | Ahmed | H01F 29/00 |
| | | | 331/181 |
| 9,130,505 B2 | 9/2015 | Zuo et al. | |
| 9,184,498 B2 | 11/2015 | Schiller | |
| 9,236,872 B2 | 1/2016 | Tsuhara et al. | |
| 9,934,898 B2* | 4/2018 | Mattsson | H01F 21/12 |
| 2007/0158782 A1* | 7/2007 | Heikkinen | H01F 17/0006 |
| | | | 257/531 |
| 2013/0135057 A1 | 5/2013 | Roithmeier | |
| 2015/0263670 A1 | 9/2015 | Fan et al. | |
| 2015/0263671 A1 | 9/2015 | Nguyen et al. | |
| 2016/0065131 A1 | 3/2016 | Pavao-Moreira et al. | |
| 2016/0254084 A1 | 9/2016 | Nilsson et al. | |
| 2019/0089302 A1 | 3/2019 | Moslehi et al. | |

* cited by examiner

Conventionally-Implemented

Open-State
$L_{off} = L_1 + L_2 + 2M$

Closed-State
$L_{on} = (L_1+M) + (L_2+M) \| (L_3-M)$

SWITCHABLE INDUCTOR NETWORK FOR WIDEBAND CIRCUITS

FIELD OF THE DISCLOSURE

This disclosure relates generally to radio frequency (RF) circuitry, more specifically to switchable inductor circuits for wideband tunable circuits in an integrated circuit (IC).

BACKGROUND

This description of related art is provided for the purpose of generally presenting a context for the disclosure that follows. Unless indicated otherwise herein, concepts described in this section are not prior art to this disclosure and are not admitted to be prior art by inclusion herein.

Many computing and electronic devices include a transceiver to facilitate communication over a wireless network or directly with other devices. To increase the available capacity of wireless bandwidth, additional bands of spectrum have been allocated for wireless access networks. To use these additional bands, integrated circuit transceivers are designed to have tunable circuits that cover an increasingly wider frequency range in various RF circuits, such as a voltage-controlled oscillator (VCO) or a front-end filter.

Covering the wide frequency range of cellular radio bands involves using multiple VCOs, which consume a large amount of power and die area of an integrated circuit. Conventional approaches to widen the tuning range of a single VCO in a transceiver can lead to a degradation of phase noise or an increase in power consumption by the VCO, as well as occupying an even larger area on an integrated circuit. Some of the conventional approaches for handling wide frequency ranges are based on dual-mode resonance tanks that employ a switched-inductor. These approaches, however, lead to a poor inductor Q (quality factor) for one mode of oscillation (e.g., the higher resonance frequency). Consequently, the phase noise of the VCO increases in the frequency band with the poor-Q inductor, which reduces the performance of the transceiver in that frequency band.

SUMMARY

In some aspects, a switchable inductor network for wideband circuits provides selectable inductance. The switchable inductor network includes a first coil and a second coil that includes a first inductive segment and a second inductive segment. The second coil includes connection points connecting the second coil across a portion of the first coil. The switchable inductor network also includes a switch connected between the first inductive segment and the second inductive segment of the second coil. The switch is configured to change an inductance of the switchable inductor network by selectively coupling the first inductive segment to the second inductive segment of the second coil in response to a control signal.

In other aspects, a switchable inductor network for wideband circuits includes a first coil and a second coil including a first inductive segment and a second inductive segment. Connection points of the second coil connect the second coil across a portion of the first coil. The switchable inductor network further includes means for selecting, in response to a control signal, an inductance of the switchable inductor network by coupling the first inductive segment of the second coil to the second inductive segment of the second coil.

In yet other aspects, a method of tuning a switchable inductor network for wideband circuits propagates a current through a first coil and, in response to a control signal, activates a switch to couple a first inductive segment of a second coil to a second inductive segment of the second coil. Based on the activation of the switch, the switchable inductor network propagates another current through the first coil and the second coil via a pair of connection points connecting the second coil across a portion of the first coil.

In further aspects, a voltage-controlled oscillator (VCO) circuit includes a switchable inductor network for wideband circuits. The switchable inductor network includes a first coil having terminals coupled to a resonant tank circuit of the VCO and a second coil including a first inductive segment and a second inductive segment. Connection points of the second coil connect the second coil across a portion of the first coil. The switchable inductor network further includes a switch connected between the first inductive segment and the second inductive segment of the second coil, with the switch configured to have a closed-state and an open-state. An inductance of the second coil is included in an inductance value of the switchable inductor network if the switch is configured in the closed-state, and the inductance of the second coil is excluded from the inductance value of the switchable inductor network if the switch is configured in the open-state.

The foregoing summary is provided to briefly introduce some of the aspects described herein. This summary is not intended to identify key or essential features of these or other aspects that are further described throughout the disclosure.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Conventionally implemented switchable inductors, such as a two-turn inductor, typically provide two different inductance values by shorting out a portion of the inductor with a switch to select between the two inductance values.

Switchable inductors provide an area-efficient alternative to fixed-value inductors in RF integrated circuits. For example, switchable inductors reduce the number of voltage-controlled oscillators (VCOs) used for frequency synthesis across multiple bands in an RF transceiver.

However, there are design tradeoffs to using conventionally implemented switchable inductors, which short out a portion of an inductor coil to change inductance values. One such tradeoff is between the area the switchable inductor occupies on an IC die and the quality factor (Q) of the inductor. For a conventionally implemented switchable inductor to have a high Q for both inductance values, the switchable inductor requires a large area on the IC die. Reducing the area occupied by the conventionally implemented switchable inductor will unfortunately degrade the Q when the switch is in a closed-state so as to short out a portion of the inductor.

In contrast with conventional approaches, this disclosure describes aspects of a switchable inductor network for wideband circuits. Apparatuses and techniques described herein may implement a switchable inductor network that includes two inductor coils: a first inductor coil and a switched, second inductor coil. With the switched, second inductor coil, inductance is added in series using a switch that shorts out a portion of the first multiple-turn inductor coil. The additional series inductor requires less additional area than alternative inductor configurations that provide two inductance values. Further, the additional series inductor does not significantly degrade the Q of the switchable inductor network if the added inductance, which is in series with the switch, is greater than a mutual inductance (M) between an inner coil and an outer coil of the multiple-turn inductor coil. The switchable inductor network for wideband circuits can be used in VCOs, tunable filters, mixer loads in upconverters and downconverters, wideband buffer amplifiers, and so forth.

These and other aspects of a switchable inductor network for wideband circuits are described below in the context of an example environment, example techniques, and example circuits, such as VCOs and mixer loads in upconverters and downconverters. Any reference made with respect to the example environment or circuits, or elements thereof, however, is by way of example and is not intended to limit any of the aspects described herein.

Example Environment

Figure 1:
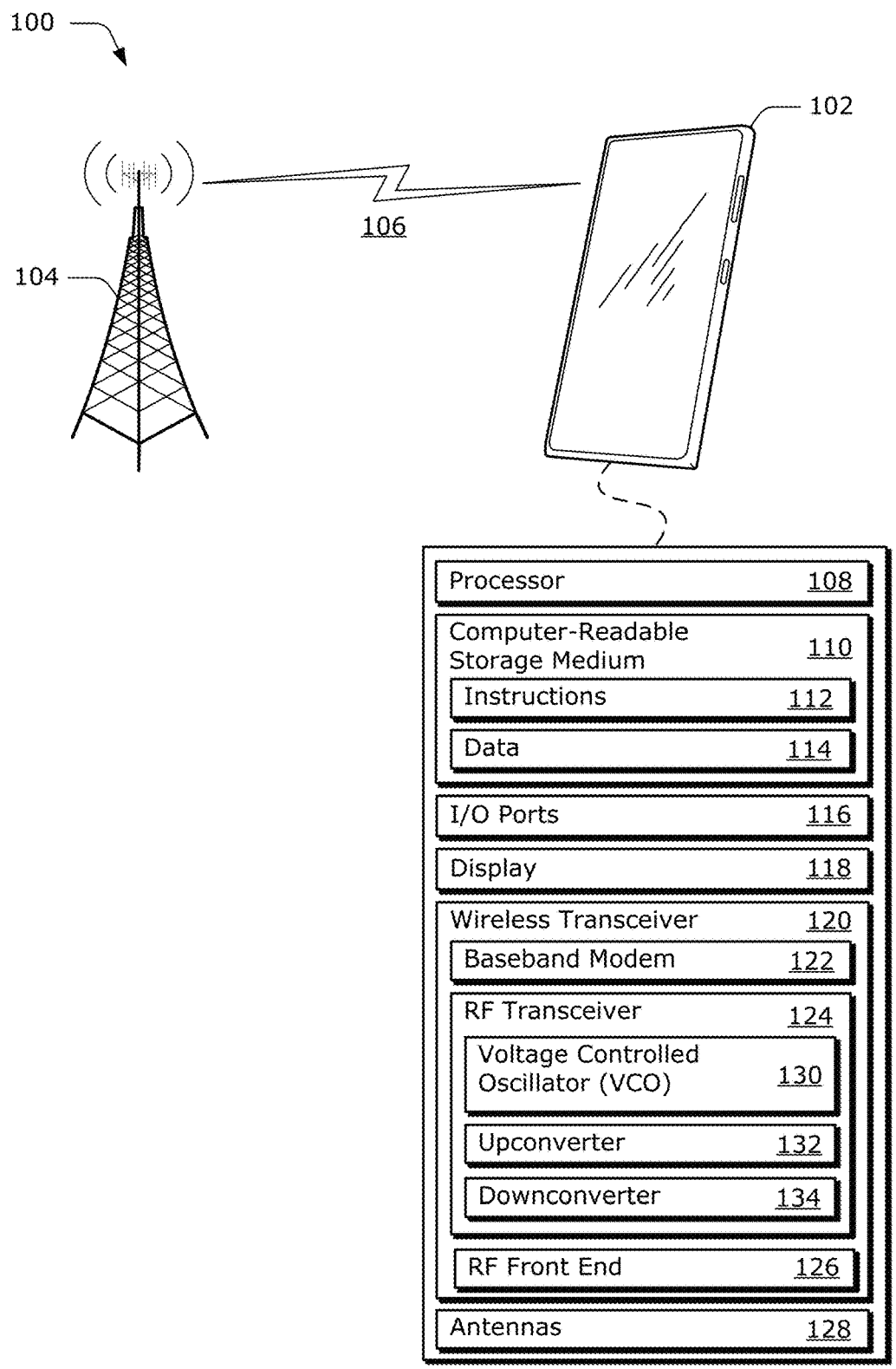
FIG. 1 illustrates an example environment that includes a computing device capable of wireless communication.

FIG. 1 illustrates an example environment 100, which includes a computing device 102 that communicates with a base station 104 through a wireless communication link 106 (wireless link 106). In this example, the computing device 102 is implemented as a smart phone. Although not shown, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and the like.

The base station 104 communicates with the computing device 102 via the wireless link 106, which may be implemented as any suitable type of wireless link. Although shown as a base station, the base station 104 may represent or be implemented as another device, such as a satellite, cable television head-end, terrestrial television broadcast tower, access point, peer-to-peer device, mesh network node, fiber optic line, and the like. Therefore, the computing device 102 may communicate with the base station 104 or another device, via a wired connection, a wireless connection, or a combination thereof.

The wireless link 106 can include a downlink of data and control information communicated from the base station 104 to the computing device 102, an uplink of other data and control information communicated from the computing device 102 to the base station 104, or both the downlink and the uplink. The wireless link 106 may be implemented using any suitable communication protocol or standard, such as 3rd Generation Partnership Project Long-Term Evolution (3GPP LTE), IEEE 802.11, IEEE 802.16, Bluetooth™, and the like.

The computing device 102 includes a processor 108 and computer-readable storage medium 110 (CRM 110). The processor 108 may include any type of processor, such as an application processor or multi-core processor, configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and the like. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, and the like. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment, the wireless transceiver 120 enables the computing device 102 to communicate with the base station 104 and networks connected therewith.

The wireless transceiver 120 includes a baseband modem 122, a radio frequency (RF) transceiver 124, and an RF front end 126 to process data and/or signals associated with communicating data of the computing device 102 over antennas 128. The baseband modem 122 may be implemented as a system-on-chip (SoC) that provides a digital communication interface for data, voice, messaging, and other applications of the computing device 102. The baseband modem 122 may also include baseband circuitry to perform high-rate sampling processes that can include analog-to-digital conversion, digital-to-analog conversion, gain correction, skew correction, frequency translation, and the like.

The RF transceiver 124 includes circuitry and logic for frequency synthesis, such as the voltage-controlled oscillator 130 (VCO 130). The RF transceiver 124 also includes circuitry and logic for frequency conversion, which may include an upconverter 132 and/or a downconverter 134, that perform frequency conversion in a single conversion step, or through multiple conversion steps. In some cases, components of the RF transceiver 124 are implemented as separate receiver and transmitter entities. The RF transceiver 124 may include logic to perform in-phase/quadrature (I/Q) operations, such as synthesis, encoding, modulation, decoding, demodulation, and the like. In some cases, the RF transceiver 124 is implemented with multiple or different sections to implement respective receiving and transmitting operations (e.g., transmit and receive chains).

The RF front end 126 may include filters, switches, and amplifiers for conditioning signals received via the antennas 128 or signals to be transmitted via the antennas 128. The implementation and use of these entities vary and is described further herein.

Figure 2:
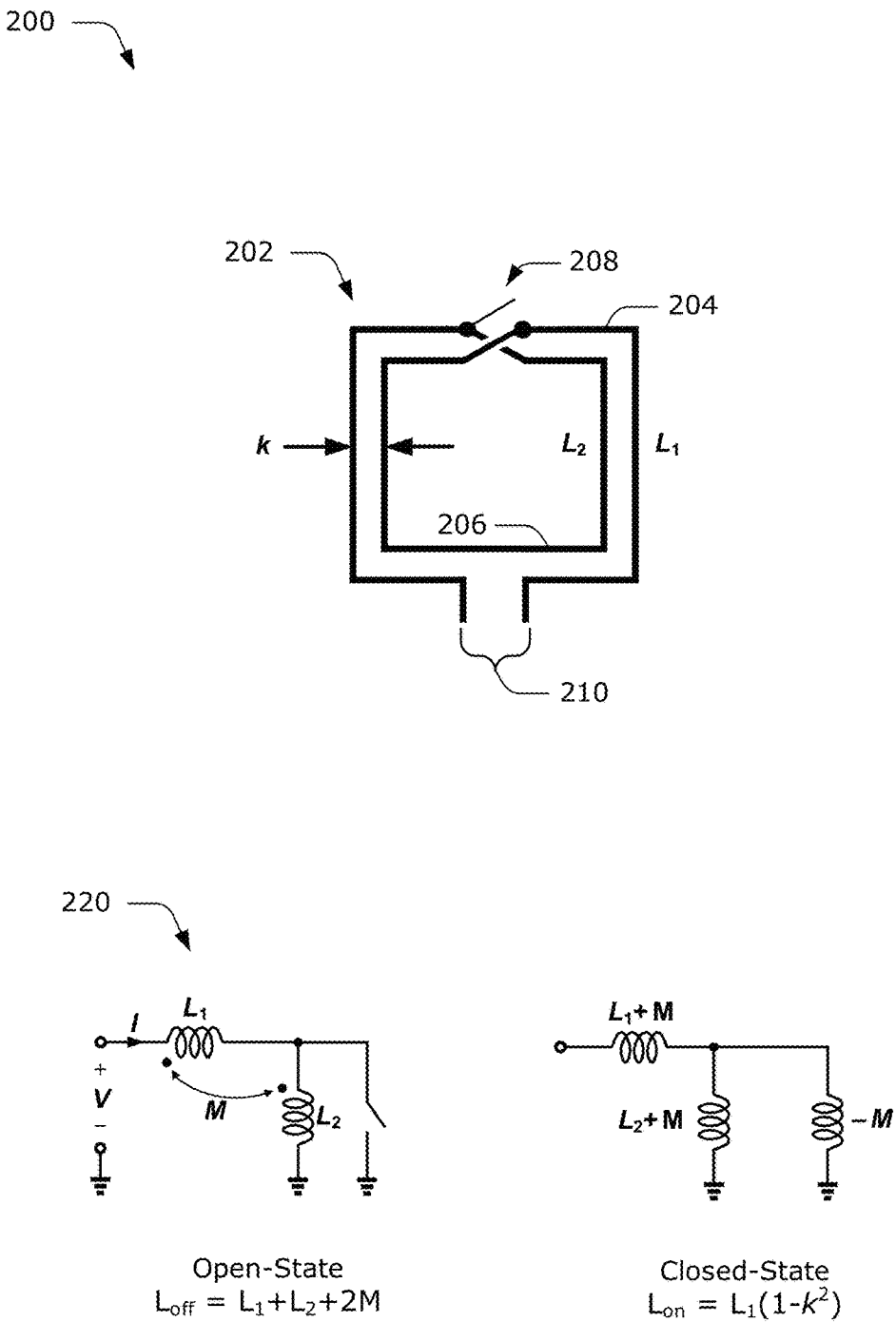
FIG. 2 illustrates an example geometry and a corresponding circuit configuration of a switchable inductor.

FIG. 2 illustrates generally at 200 an example geometry and corresponding circuit configuration of a conventionally implemented switchable inductor. In this particular example, a simplified physical layout (e.g., geometry) of a two-turn coil 202 is shown with an outer coil 204 having an inductance $L_1$, and an inner coil 206 having an inductance $L_2$. A switch 208 is connected across a portion of the outer coil 204. In a closed-state, the switch 208 shorts out the inner coil 206 to change the value of inductance as seen at terminals 210 of the two-turn coil 202.

Electrical schematics of the two-turn coil 202, for both an open-state and a closed-state of the switch 208, are shown at 220, where M is the mutual inductance between the outer coil 204 ($L_1$) and the inner coil 206 ($L_2$). The inductance ($L_{open}$) of the two-turn coil 202, when the switch 208 is in the open-state, is $L_{open}=L_1+L_2+2M$. In the closed-state, even if the switch 208 is a lossless switch, the geometry of the two-turn coil 202 exhibits a degraded Q due to interaction between the outer coil 204 and the inner coil 206.

In the closed-state, with the inner coil 206 shorted out by the switch 208, the expected value of inductance at the terminals 210 is $L_1$. However, even if the switch 208 is an ideal switch, there is still interaction between the outer coil 204 and the inner coil 206 that reduces the inductance. Thus, instead of the inductance in the closed-state ($L_{closed}$) being $L_1$, the closed-state inductance is reduced, where $L_{closed}=L_1(1-k^2)$, where k is the coupling factor between the outer coil 204 and the inner coil 206.

Example Switchable Inductor Network for Wideband Circuits

Figure 3:
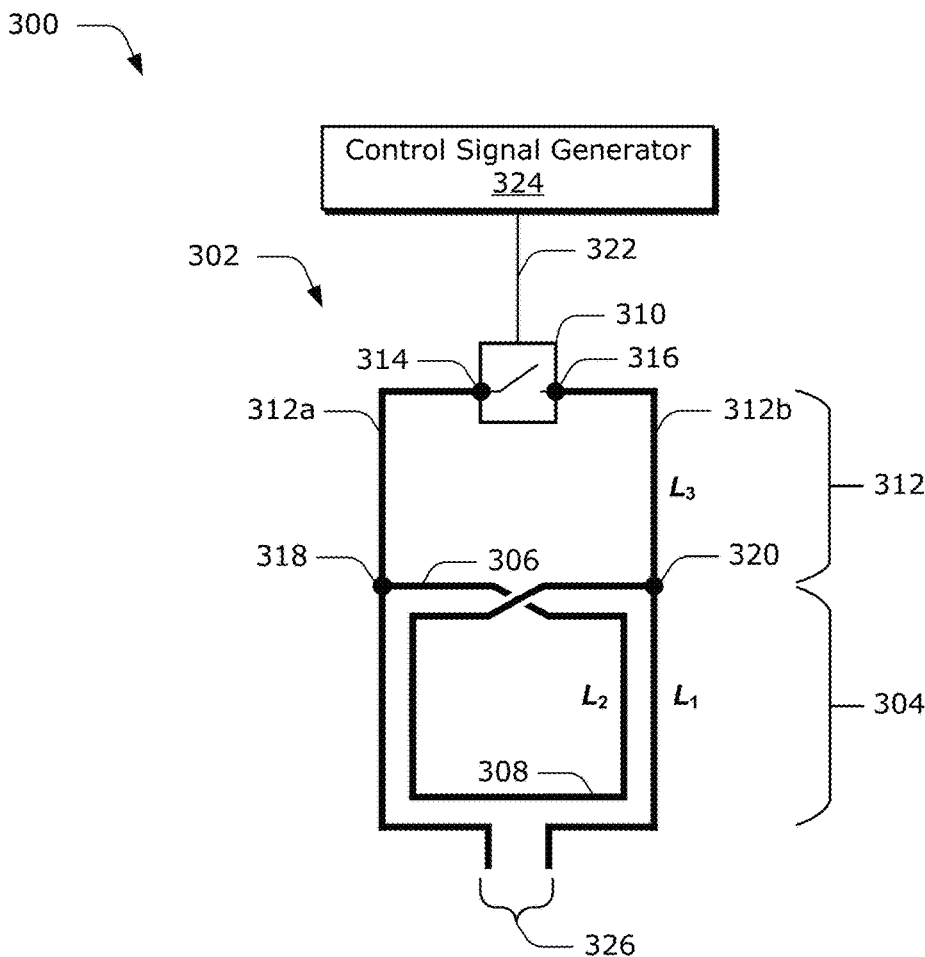
FIG. 3 illustrates an example geometry and a corresponding circuit configuration in accordance with aspects of a switchable inductor network for wideband circuits as described herein.
Figure 3:
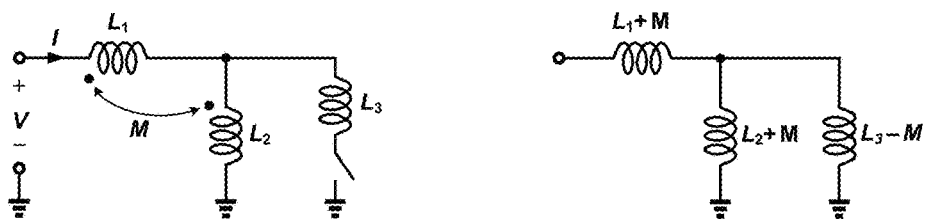

FIG. 3 illustrates generally at 300 an example geometry and corresponding circuit configuration in accordance with aspects of a switchable inductor network for wideband circuits. In this particular example, a switchable inductor network 302 includes a two-turn coil, or first coil 304, that includes an outer coil 306 having an inductance $L_1$ and an inner coil 308 having an inductance $L_2$. A switch 310 is connected across a portion of the outer coil 306 by two segments of a second coil 312 having an inductance $L_3$. The second coil 312 includes a first inductive segment 312a and a second inductive segment 312b. In some example implementations, the first inductive segment 312a and the second inductive segment 312b are substantially equal in length. The switch 310 is connected to the first inductive segment 312a at a first terminal 314 of the switch 310 and to the second inductive segment 312b at a second terminal 316 of the switch 310. The first inductive segment 312a of the second coil 312 is connected in series between a first connection point 318 on the outer coil 306 and the first terminal 314 of the switch 310. The second inductive segment 312b of the second coil 312 is connected in series between a second connection point 320 on the outer coil 306 and the second terminal 316 of the switch 310. Any suitable switching circuitry can be used to implement the switch 310, such as a field effect transistor (FET).

The switch 310 is operated (e.g., activated to the closed-state or deactivated to the open-state) in response to a control signal 322 from a control signal generator 324. The control signal generator 324 generates the control signal 322 based on control parameters of the circuitry that incorporates the switchable inductor network 302. For example, in a VCO, the control signal generator 324 generates the control signal 322 based on a frequency band of operation (e.g., changes the switch state to match a corresponding frequency band). Terminals 326 are connected to the outer coil 306 to couple the switchable inductor network 302 to other circuit elements.

The electrical schematics of the switchable inductor network 302, for the open-state and the closed-state of the switch 310, are shown at 330. The mutual inductance (M) is illustrated between the outer coil 306 ($L_1$) and the inner coil 308 ($L_2$). The second coil 312 ($L_3$) is also depicted. If the switch 310 is in the open-state, the open-state inductance ($L_{open}$) of the switchable inductor network 302 is $L_{open}=L_1+L_2+2M$.

On the other hand, in the closed-state, the switch 310 couples the inner coil 308 in parallel with the second coil 312. The inductance value of the second coil 312, $L_3$, is chosen such that $L_3 \geq M$. Assuming that the switch 310 is an ideal switch, this constraint results in no significant degradation of the Q for the switchable inductor network 302 in either the closed-state or the open-state. Thus, the closed-state inductance ($L_{closed}$) of the switchable inductor network 302 becomes:

$$L_{closed}=(L_1+M)+(L_2+M)\|(L_3-M) \qquad (1)$$

Figure 4:
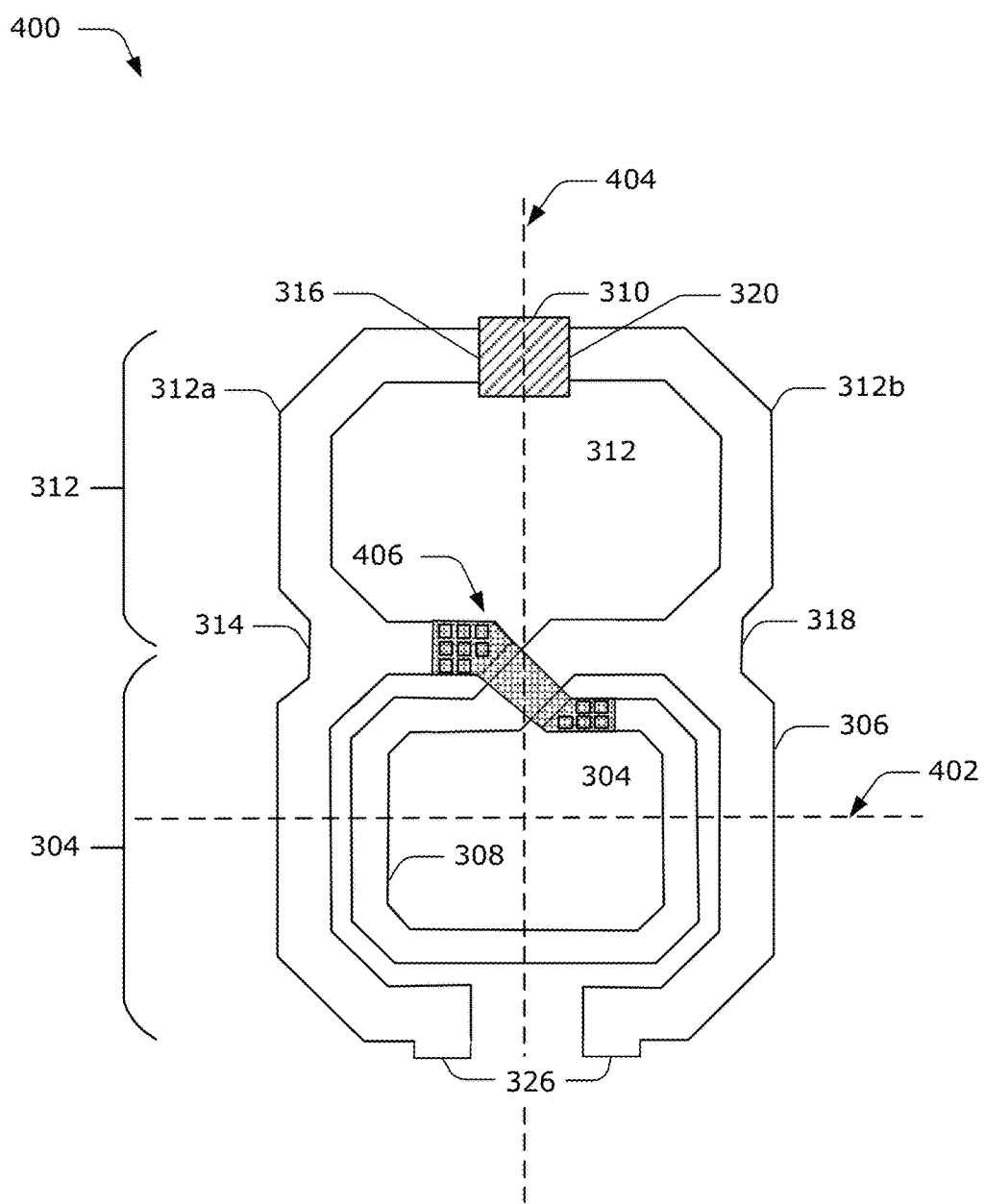
FIG. 4 illustrates an example physical layout in accordance with aspects of a switchable inductor network for wideband circuits as described in reference to FIG. 3.

In an aspect of the switchable inductor network for wideband circuits, FIG. 4 illustrates a physical layout 400 of the switchable inductor network 302 described with reference to FIG. 3. By way of example, the switchable inductor network 302 illustrated in FIG. 4 is shown with a multiple-turn first coil 304 having a single-turn outer coil 306 and a single-turn inner coil 308 and with a single-turn second coil 312. However, other configurations using multiple-turn coils for the inner, outer, or second coils are contemplated, as described below with reference to FIG. 5.

The outer coil 306 and the inner coil 308 of the first coil 304 are disposed concentrically along a common horizontal axis, shown at 402, and a common vertical axis, shown at 404. The inner coil 308 is nested entirely inside the outer coil 306. The outer coil 306 and the inner coil 308 are concentric with inner coil 308 having a smaller radius than the outer coil 306. The outer coil 306 and the inner coil 308 overlap without a direct electrical connection (e.g., without making direct electrical contact) in the region of the overlap, as shown at 406, for example by overlapping the coils on two metal layers that are separated by an insulator. The cross-hatched shading at 406 illustrates the area of the overlap between the outer coil 306 and the inner coil 308. Except for the overlap, the first coil 304 and the second coil 312 are formed on a first metal layer. The overlap, illustrated by the cross-hatched area at 406, is implemented on a second metal layer that is separated by an insulating layer from the first metal layer. The squares within the cross-hatched shading at 406 illustrate metal vias that form an electrical connection between portions of first coil 304 on the first metal layer and the portion of the first coil 304 on the second metal layer. The relative size and number of metal vias are simply for the purpose of illustration. Any suitable number of metal vias of any suitable size and/or shape may be used. The second coil 312 is displaced along the same vertical axis, and adjacent to, the outer coil 306. The switch 310 is placed at the midpoint of the second coil 312, with the first inductive segment 312a and the second inductive segment 312b being substantially equal in length. The terminals 326, for connection to other circuit components, are disposed at the opposite end of the switchable inductor network 302 from the switch 310.

Figure 5:
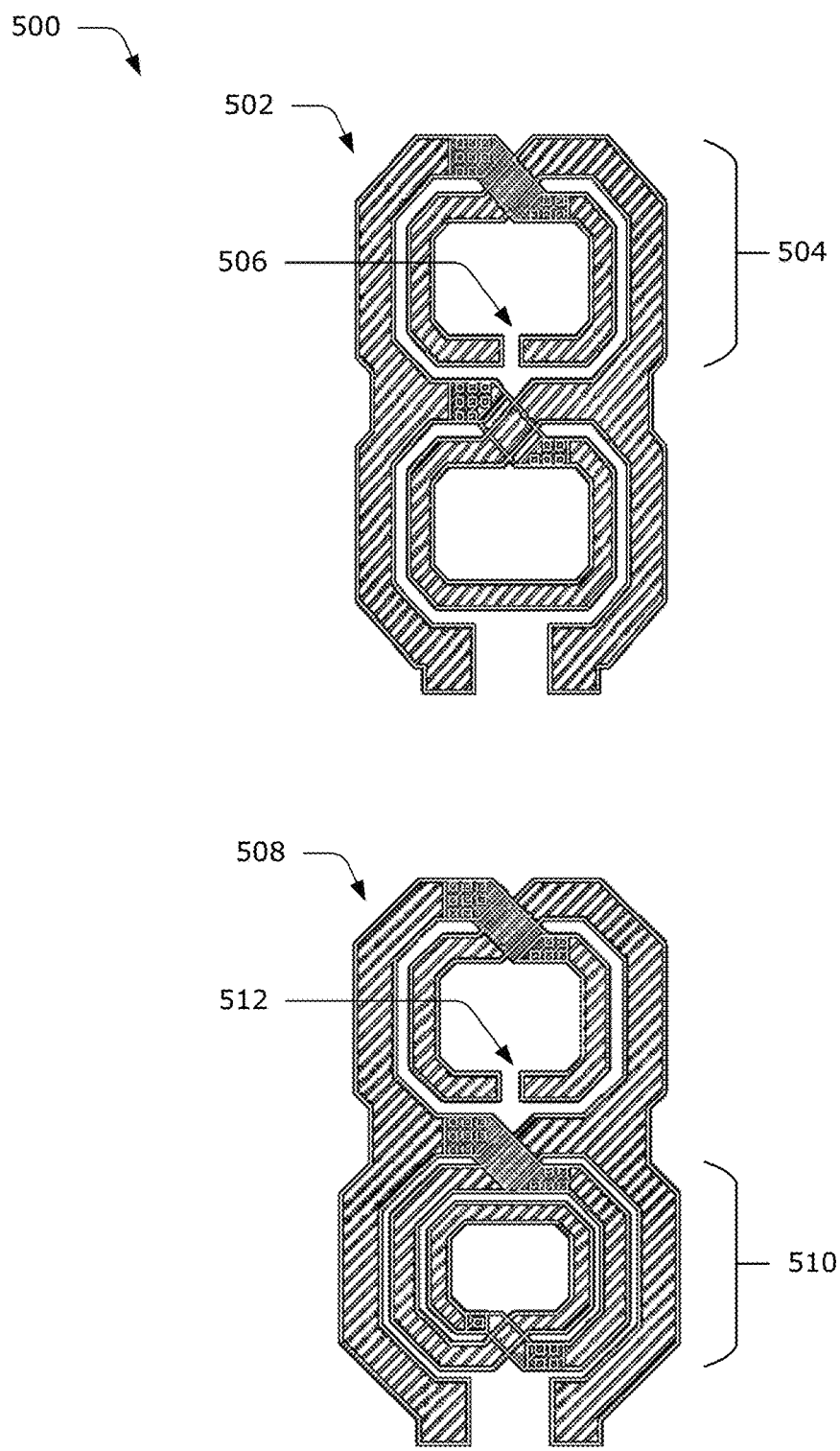
FIG. 5 illustrates further examples of physical layouts in accordance with aspects of a switchable inductor network for wideband circuits that employ multiple-turn coils.

FIG. 5 illustrates generally at 500 alternative aspects of a switchable inductor network for wideband circuits. In an example, a switchable inductor network 502 is illustrated with a two-turn second coil 312, which is indicated at 504. In switchable inductor networks 302 having an even number of turns in the second coil 312, the switch 310 can be disposed at the bottom of the second coil 312, as is indicated at a gap 506 (but a switch is not specifically depicted). However, in switchable inductor networks 302 with an odd number of turns in the second coil 312, the switch 310 can be disposed at the top of the second coil 312, as is illustrated in FIG. 4. In another example, a switchable inductor network 508 is illustrated with a two-turn second coil 312 and a two-turn inner coil 308 (of the first coil 304), which is indicated at 510 in FIG. 5. The switch 310, in the switchable inductor network 508, can be disposed at the bottom of the second coil 312, as is indicated at a gap 512 (but a switch is not specifically depicted). The number of coils that are implemented may vary based on the desired inductance values for the closed-state inductance and the open-state inductance of the switchable inductor network 302, as well as being chosen to maintain a high Q value for the switchable inductor network 302 in both the closed-state and the open-state.

Techniques of a Switchable Inductor Network for Wideband Circuits

The following techniques of a switchable inductor network for wideband circuits may be implemented using the previously described elements of the example environment, components, or circuits. Reference to elements, such as the outer coil 306, the inner coil 308, the second coil 312, and the control signal 322, is made by example and is not intended to limit the ways in which the techniques can be implemented.

The techniques are described with reference to an example method illustrated in FIG. 6, which is depicted as respective sets of operations or acts that may be performed by entities described herein. The operations described herein may be performed using any suitable circuitry or component, which may provide means for implementing one or more of the operations. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 6:
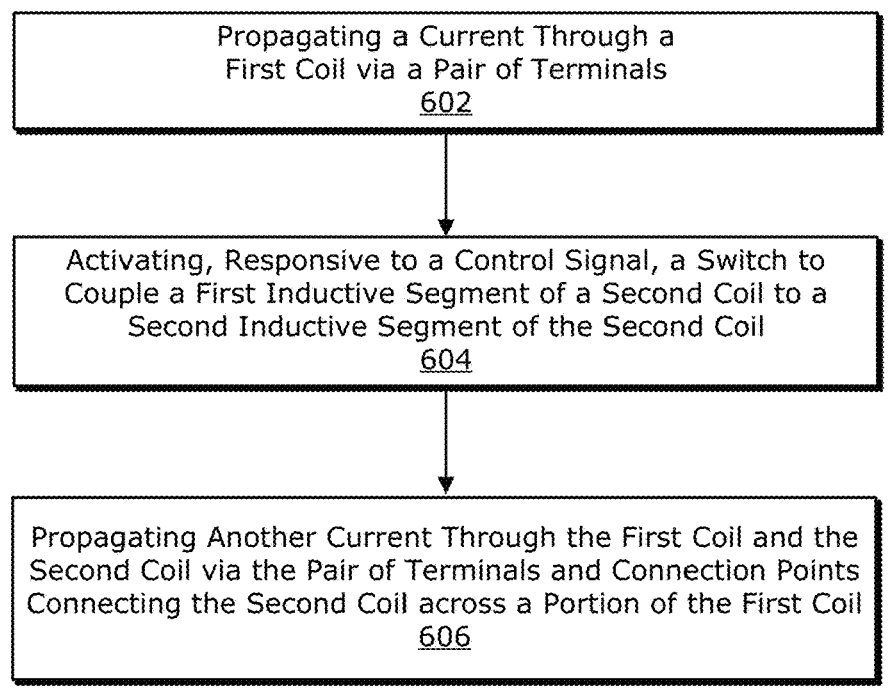
FIG. 6 illustrates an example method for aspects of a switchable inductor network for wideband circuits.

FIG. 6 illustrates an example method 600 for tuning a switchable inductor network for wideband circuits that generally relates to providing variable inductance in RF circuits, including operations performed by a switchable inductor network 302.

At 602, a switchable inductor network (e.g., switchable inductor network 302) propagates a current through a first coil (e.g., first coil 304 including outer coil 306 and inner coil 308) via a pair of terminals (e.g., terminals 326).

At 604, the switchable inductor network activates a switch (e.g., switch 310) in response to a control signal (e.g., control signal 322), to couple a first inductive segment (e.g., first inductive segment 312a) of a second coil (e.g., second coil 312) to a second inductive segment (e.g., second inductive segment 312b) of the second coil (e.g., second coil 312).

At 606, based on the activating, the switchable inductor network, propagates another current through the first coil (e.g., first coil 304 including outer coil 306 and inner coil 308) and the second coil (e.g., second coil 312) via the pair of terminals (e.g., as represented by terminals 326) and connection points (e.g., first connection point 318 and second connection point 320) connecting the second coil (e.g., second coil 312) across a portion (e.g., at first connection point 318 and second connection point 320) of the first coil (e.g., first coil 304 including outer coil 306 and inner coil 308).

Applications of a Switchable Inductor Network for Wideband Circuits

As discussed above, the switchable inductor network for wideband circuits can be used in a variety of RF circuits that employ tunable elements. Examples include RF and intermediate frequency (IF) filters; VCOs; impedance-matching networks between circuit elements, such as mixers and amplifiers; wide-range buffer amplifiers; and so forth.

Figure 7:
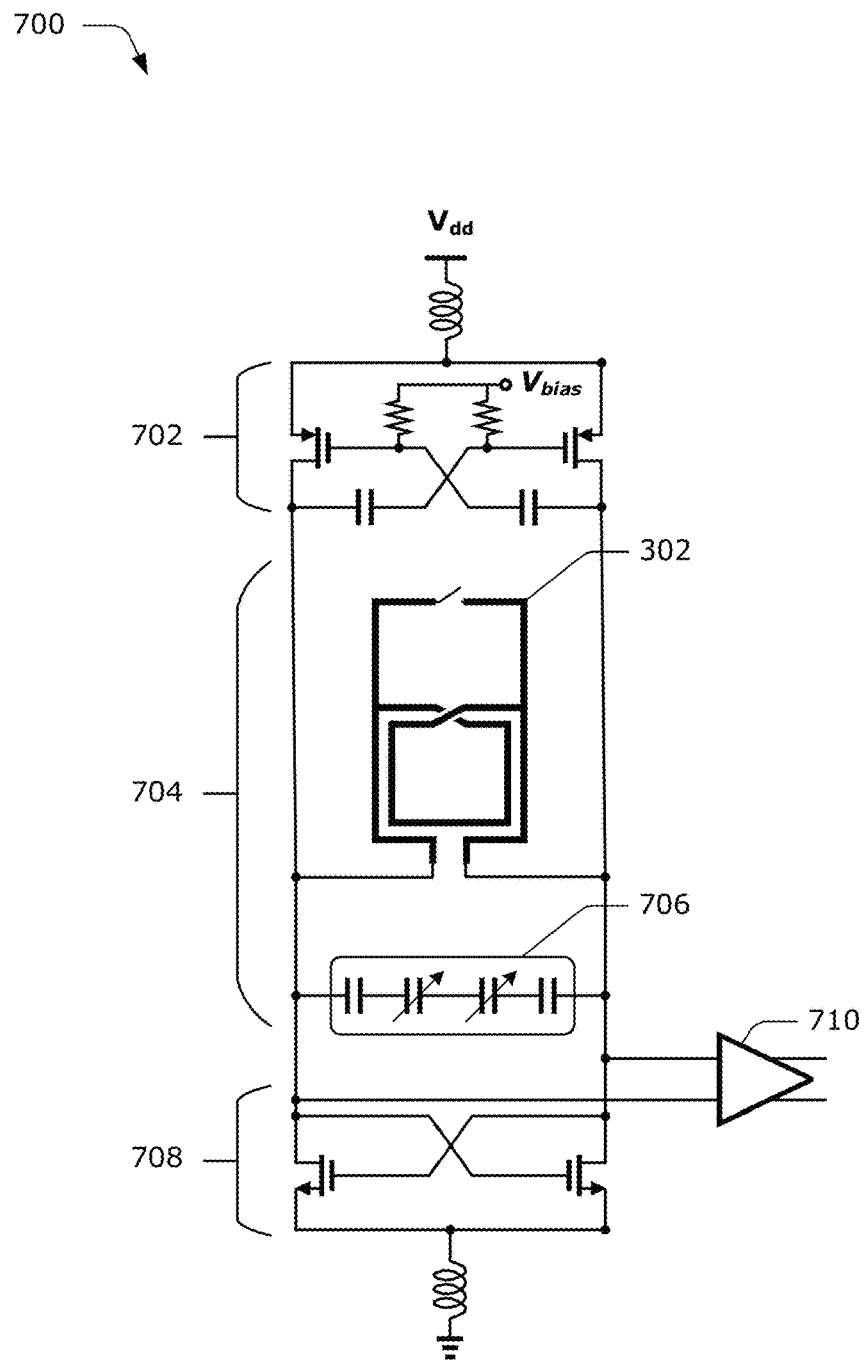
FIG. 7 illustrates an example VCO that employs a switchable inductor network for wideband circuits.

By way of example, consider FIG. 7, which illustrates the use of the switchable inductor network 302 in a resonant tank circuit 704 of a voltage-controlled oscillator 700 (VCO 700). In this example, the VCO 700 is illustrated as a simplified version of a differential VCO using cross-coupled PMOS and NMOS device pairs. However, the switchable inductor network 302 can be used as a tunable inductor in the resonant circuit of various VCO circuit topologies.

The VCO 700 includes a cross-coupled pair of PMOS devices, shown at 702. The sources of the PMOS devices are connected to a supply voltage, $V_{dd}$, and the gates of the PMOS devices are connected through resistors to a bias voltage, $V_{bias}$. The gate of each PMOS device is capacitively cross-coupled to the drain of the opposite PMOS device, and the drains of the PMOS devices are connected to the tank circuit 704.

The tank circuit 704 includes the switchable inductor network 302 coupled in parallel to a tunable capacitor, which is shown as a varactor bank 706 that is tunable in response to a tuning control signal (not shown). The tank circuit 704 is in turn coupled to the drains of a cross-coupled pair of NMOS devices, which are shown at 708. The gate of the each NMOS device is cross coupled to the drain of the other NMOS device, and the sources of the NMOS devices are connected to ground. A differential buffer amplifier 710 is connected across the terminals of the tank circuit 704 to provide the output signal from the VCO.

Figure 8:
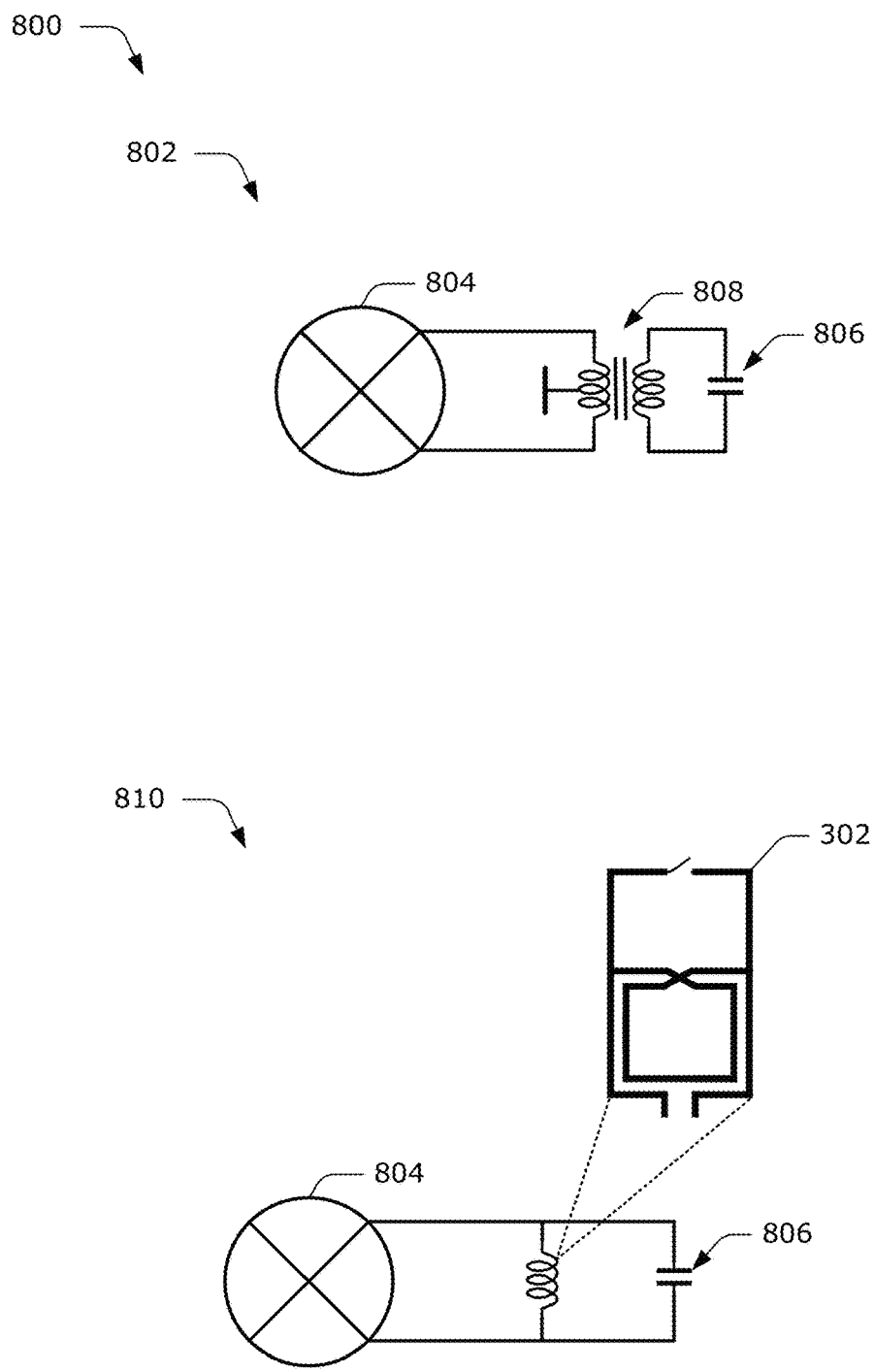
FIG. 8 illustrates an example of a wideband mixer load that employs a switchable inductor network for wideband circuits.

In another example, consider FIG. 8, which illustrates generally at 800 the use of the switchable inductor network as a mixer load for wideband operation. Generally, mixer outputs are balanced and have a high output impedance. Mixer outputs are typically coupled to other circuit elements using a balun. However, the load provided by the balun may be too low and reduce the voltage swing of the output signal of the balanced mixer. Conventional impedance matching of a balanced mixer output using a balun is illustrated at 802. The output of a mixer 804 is matched to the input of one or more amplifiers, which are illustrated as a parasitic capacitance 806. A balun 808 is used to match the impedance of the mixer 804 to that of the parasitic capacitance 806.

In contrast, with the example at 810, the switchable inductor network 302 is used in place of the balun 808 to match the output impedance of the mixer 804 to the input impedance of the parasitic capacitance 806. The use of the switchable inductor network 302 provides a higher impedance load across the output of the mixer 804, which results in a greater output voltage swing over a wider frequency range. The parasitic capacitance 806 also determines the maximum inductance that can be used in tuning the mixer output. The use of the switchable inductor network 302 provides a wider tuning range and better equalization of gain with respect to tuning frequency for the output of the mixer 804 compared to the use of a balun.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   a switchable inductor network comprising:
   a first coil including an inner coil and an outer coil, the first coil including a first connection point and a second connection point, the first coil disposed along at least one axis at a first position;
   a second coil including a first inductive segment and a second inductive segment, the first inductive segment connected to the first connection point of the first coil, and the second inductive segment connected to the second connection point of the first coil; the second coil disposed along the at least one axis at a second position, the second position different from the first position; and
   a switch connected between the first inductive segment of the second coil and the second inductive segment of the second coil, the switch configured to change, in response to a control signal, an inductance of the switchable inductor network by selectively coupling the first inductive segment of the second coil to the second inductive segment of the second coil to thereby connect the second coil across a portion of the first coil.

2. The apparatus of claim 1, wherein the second position is different from the first position such that the second coil and the first coil are not concentric with respect to each other.

3. The apparatus of claim 1, wherein the inner coil and the outer coil of the first coil are concentric.

4. The apparatus of claim 1, wherein the inner coil and the outer coil of the first coil are formed on a single metal layer excepting a region of overlap.

5. The apparatus of claim 1, wherein the apparatus comprises a computing device, the computing device includes at least one wireless transceiver, and the at least one wireless transceiver comprises the switchable inductor network.

6. The apparatus of claim 1, wherein at least one of the inner coil or the outer coil overlaps the other without direct electrical contact in a region of overlap.

7. The apparatus of claim 1, wherein the inner coil of the first coil is nested within the outer coil of the first coil.

8. The apparatus of claim 7, wherein an inductance of the second coil is greater than or equal to a mutual inductance between the inner coil of the first coil and the outer coil of the first coil.

9. The apparatus of claim 7, wherein the second coil and the outer coil of the first coil have substantially similar dimensions.

10. The apparatus of claim 7, wherein the first connection point and the second connection point are positioned on the outer coil of the first coil, an overlap of the inner coil and the outer coil being disposed between the first connection point and the second connection point.

11. The apparatus of claim 10, wherein the connection of the second coil across the portion of the outer coil of the first coil is configured to couple the inner coil of the first coil and the second coil in parallel if the switch is in a closed-state, and the switch is configured to couple the first inductive segment of the second coil to the second inductive segment of the second coil in the closed-state.

12. The apparatus of claim 1, wherein the second coil has multiple turns.

13. The apparatus of claim 12, wherein the multiple turns of the second coil comprise an outer turn and an inner turn, the inner turn being nested within the outer turn.

14. The apparatus of claim 1, wherein the switch is configured to change, in response to the control signal, the inductance of the switchable inductor network by selectively decoupling the first inductive segment of the second coil from the second inductive segment of the second coil to thereby disconnect the second coil from being across the portion of the first coil.

15. The apparatus of claim 1, wherein the switch comprises a transistor having a drain and a source, and the drain and the source switchably couple the first inductive segment of the second coil to the second inductive segment of the second coil.

16. The apparatus of claim 1, wherein the first inductive segment of the second coil and the second inductive segment of the second coil are substantially equal in length.

17. The apparatus of claim 1, wherein the switch is disposed at ends of the first inductive segment and the second inductive segment that are opposite from other ends of the first inductive segment and the second inductive segment that respectively connect to the first connection point of the first coil and the second connection point of the first coil.

18. The apparatus of claim 1, wherein:
   the second coil is positioned adjacent to the first coil;
   the first coil and the second coil are symmetric about the at least one axis;
   terminals of the first coil are positioned symmetrically about the at least one axis; and
   the first connection point of the first coil and the second connection point of the first coil are symmetric about the at least one axis.

19. The apparatus of claim 1, wherein the first coil and the second coil are symmetric about the at least one axis, and the switch is positioned along the at least one axis.

20. A switchable inductor network, the switchable inductor network comprising:
   a first coil including an inner coil and an outer coil, the first coil including a first connection point and a second connection point, the first coil disposed along at least one axis at a first position;
   a second coil including a first inductive segment and a second inductive segment, the first inductive segment connected to the first connection point of the first coil, and the second inductive segment connected to the second connection point of the first coil; the second coil disposed along the at least one axis at a second position, the second position different from the first position; and means for selecting an inductance of the switchable inductor network in response to a control signal by selectively coupling the first inductive segment of the second coil to the second inductive segment of the second coil to thereby connect the second coil across a portion of the first coil.

21. The switchable inductor network of claim 20, wherein the means for selecting the inductance of the switchable inductor network in response to the control signal comprises means for selecting the inductance of the switchable inductor network in response to the control signal by selectively decoupling the first inductive segment of the second coil from the second inductive segment of the second coil to thereby disconnect the second coil from being across the portion of the first coil.

22. The switchable inductor network of claim 20, wherein the means for selecting the inductance comprises a switch that is connected between the first inductive segment of the second coil and the second inductive segment of the second coil.

23. The switchable inductor network of claim 20, wherein the first coil and the second coil are symmetric about the at least one axis, and the means for selecting the inductance is positioned along the at least one axis.

24. The switchable inductor network of claim 23, wherein of claim 20, wherein at least one of the inner coil or the outer coil overlaps the other without direct electrical contact in a region of overlap.

25. The switchable inductor network of claim 20, wherein an inductance of the second coil is greater than or equal to a mutual inductance between the inner coil of the first coil and the outer coil of the first coil.

26. The switchable inductor network of claim 20, wherein:
the second coil has multiple turns;
the multiple turns of the second coil comprise an outer turn and an inner turn, the inner turn being nested within the outer turn; and
at least one turn of the multiple turns of the second coil overlaps another turn of the second coil without direct electrical contact in a region of overlap.

27. A method for operating a switchable inductor network, the method comprising:
propagating a current through a first coil including an inner coil and an outer coil, the first coil including a first connection point and a second connection point, the first coil disposed along at least one axis at a first position;
activating, responsive to a control signal, a switch to selectively couple a first inductive segment of a second coil to a second inductive segment of the second coil, the first inductive segment connected to the first connection point of the first coil, and the second inductive segment connected to the second connection point of the first coil; the second coil disposed along the at least one axis at a second position, the second position different from the first position; and
based on the activating, propagating another current through the first coil and the second coil via the first connection point and the second connection point connecting the second coil across a portion of the first coil.

28. The method of claim 27, wherein the activating the switch comprises providing a first inductance at terminals of the switchable inductor network.

29. The method of claim 28, further comprising:
deactivating, responsive to the control signal, the switch to selectively decouple the first inductive segment of the second coil from the second inductive segment of the second coil; and
based on the deactivating, propagating the current through the first coil and bypassing the second coil.

30. The method of claim 29, wherein the deactivating the switch comprises providing a second inductance at the terminals of the switchable inductor network.

31. The method of claim 27, further comprising:
using the switchable inductor network to process a signal communicated wirelessly via one or more antennas.

32. The method of claim 27, wherein the activating the switch comprises coupling, based on a connection of the second coil across the portion of the outer coil of the first coil, the inner coil of the first coil and the second coil in parallel for a closed-state of the switch.

33. The method of claim 27, wherein a variable capacitance is coupled to terminals of the switchable inductor network to form a resonant tank circuit, the variable capacitance being variable in response to a tuning control signal.

34. The method of claim 27, wherein terminals of the switchable inductor network are coupled to an output of a balanced mixer, the method further comprising:
controlling the switchable inductor network with the control signal to cause an output impedance of the balanced mixer to match an input impedance of circuitry coupled to the output of the balanced mixer.

35. A voltage-controlled oscillator (VCO) circuit including a switchable inductor network, the switchable inductor network comprising:
a first coil having terminals coupled to a resonant tank circuit of the VCO, the first coil including an inner coil and an outer coil, the first coil including a first connection point and a second connection point, the first coil disposed along at least one axis at a first position;
a second coil including a first inductive segment and a second inductive segment, the first inductive segment connected to the first connection point of the first coil, and the second inductive segment connected to the second connection point of the first coil; the second coil disposed along the at least one axis at a second position, the second position different from the first position; and
a switch connected between the first inductive segment of the second coil and the second inductive segment of the second coil, the switch configured to selectively have a closed-state or an open-state, an inductance of the second coil being included in an inductance value of the switchable inductor network in the closed-state in which the second coil is connected across a portion of the first coil, and the inductance of the second coil being excluded from the inductance value of the switchable inductor network in the open-state.

36. The VCO circuit of claim 35, wherein:
the switch is configured to change between the closed-state and the open-state based on a control signal;
the control signal configures a frequency band of operation of the VCO; and
the closed-state corresponds to a first frequency band, and the open-state corresponds to a second frequency band.

* * * * *